United States Patent
Mulhern et al.

(10) Patent No.: US 9,250,277 B1
(45) Date of Patent: Feb. 2, 2016

(54) MAGNETICALLY COUPLED, HIGH RESOLUTION LINEAR POSITION SENSOR FOR USE IN HIGH TEMPERATURE, HIGH PRESSURE ENVIRONMENT

(75) Inventors: Mark D. Mulhern, Timonium, MD (US); Joseph M. Maurio, Westminster, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 989 days.

(21) Appl. No.: 13/425,224

(22) Filed: Mar. 20, 2012

Related U.S. Application Data

(60) Provisional application No. 61/454,795, filed on Mar. 21, 2011.

(51) Int. Cl.
*G01R 25/06* (2006.01)
*G01R 27/02* (2006.01)

(52) U.S. Cl.
CPC ............... *G01R 25/06* (2013.01); *G01R 27/02* (2013.01)

(58) Field of Classification Search
None
See application file for complete search history.

(56) References Cited

U.S. PATENT DOCUMENTS

| | | | | |
|---|---|---|---|---|
| 3,594,740 A | * | 7/1971 | Comeau et al. | 340/870.27 |
| 3,601,730 A | * | 8/1971 | Cookerly et al. | 335/306 |
| 3,919,043 A | * | 11/1975 | Reid | 376/258 |
| 4,071,818 A | * | 1/1978 | Krisst | 324/207.13 |
| 4,289,987 A | * | 9/1981 | Russell et al. | 310/26 |
| 4,458,240 A | * | 7/1984 | Rittenbach et al. | 340/552 |
| 4,516,063 A | * | 5/1985 | Kaye et al. | 318/685 |
| 4,604,576 A | * | 8/1986 | Barrault | 324/207.16 |
| 4,629,983 A | * | 12/1986 | Boomgaard et al. | 324/207.19 |
| 4,631,537 A | * | 12/1986 | Neuner et al. | 340/870.17 |
| 4,646,012 A | * | 2/1987 | Feilchenfeld et al. | 324/207.12 |
| 4,654,590 A | * | 3/1987 | Kitaura et al. | 324/207.13 |
| 4,683,106 A | * | 7/1987 | Jahnke | 376/259 |
| 4,714,926 A | * | 12/1987 | Neuner et al. | 340/870.36 |
| 4,756,076 A | * | 7/1988 | Dyben et al. | 29/613 |
| 4,965,040 A | * | 10/1990 | Huston | 376/236 |
| 5,156,636 A | * | 10/1992 | Kuljis | 73/597 |
| 5,247,172 A | * | 9/1993 | Riemer | 250/227.21 |
| 5,392,321 A | * | 2/1995 | Gaussa et al. | 376/258 |
| 5,410,255 A | * | 4/1995 | Bailey | 324/525 |
| 5,524,030 A | * | 6/1996 | White et al. | 376/260 |
| 5,563,922 A | * | 10/1996 | Beltz et al. | 376/258 |

(Continued)

FOREIGN PATENT DOCUMENTS

| | | |
|---|---|---|
| JP | 54050785 A | 4/1979 |
| JP | 2000121781 A | 4/2000 |

(Continued)

*Primary Examiner* — Jermele M Hollington
*Assistant Examiner* — Suresh K Rajaputra
(74) *Attorney, Agent, or Firm* — Marsteller & Associates, P.C.

(57) ABSTRACT

A high resolution, high reliability, magnetically coupled, linear position sensor (50) provides a means of determining the position of an object (51) using a methodology that does not require a direct mechanical or physical connection between the sensor (50) and the object (53) whose position is to be determined. The sensor (50) can operate in a high temperature, high pressure fluid with exposure to moderate levels of radioactivity. The sensor (50) utilizes dual rod elements with a magnetically coupled bridging contact slider (51) supported by a ceramic guide all of which are contained within a non magnetic pressure housing. The topology of the sensor (50) supports at least two types of measurement techniques, Time Domain Reflectometry (TDR) as well as linear resistive to determine target (51) position.

8 Claims, 4 Drawing Sheets

(56) References Cited

U.S. PATENT DOCUMENTS

| | | | |
|---|---|---|---|
| 5,566,216 A * | 10/1996 | Ly | 376/258 |
| 5,568,528 A * | 10/1996 | Gaussa et al. | 376/258 |
| 5,998,991 A | 12/1999 | Begin | |
| 6,192,096 B1 * | 2/2001 | Ichikawa et al. | 376/258 |
| 7,505,545 B2 * | 3/2009 | Kim et al. | 376/228 |
| 7,569,810 B1 * | 8/2009 | Troxler et al. | 250/269.1 |
| 8,351,561 B2 * | 1/2013 | Hashemian et al. | 376/258 |
| 8,442,180 B2 * | 5/2013 | Nakamura et al. | 376/258 |
| 8,824,617 B2 * | 9/2014 | Sexton et al. | 376/258 |
| 2002/0170424 A1 * | 11/2002 | Brown et al. | 92/5 R |
| 2003/0001592 A1 * | 1/2003 | Boronkay et al. | 324/699 |
| 2007/0086556 A1 * | 4/2007 | Nakamura et al. | 376/258 |
| 2008/0105059 A1 * | 5/2008 | Turnbull et al. | 73/779 |
| 2008/0174302 A1 * | 7/2008 | Lee et al. | 324/207.16 |
| 2008/0211522 A1 * | 9/2008 | Mohr et al. | 324/699 |
| 2008/0310576 A1 * | 12/2008 | Brisson et al. | 376/258 |
| 2011/0222640 A1 * | 9/2011 | DeSantis | 376/229 |

FOREIGN PATENT DOCUMENTS

| | | | |
|---|---|---|---|
| JP | 2006308385 A | 11/2006 | |
| JP | 2008309792 A | 12/2008 | |
| WO | WO 2008138848 A2 * | 11/2008 | G01D 5/14 |

* cited by examiner

MAGNETICALLY COUPLED, HIGH RESOLUTION LINEAR POSITION SENSOR FOR USE IN HIGH TEMPERATURE, HIGH PRESSURE ENVIRONMENT

CROSS REFERENCE TO RELATED APPLICATIONS

This application claims the benefit of U.S. Provisional Application Ser. No. 61/454,795, filed Mar. 21, 2011, entitled MAGNETICALLY COUPLED, HIGH RESOLUTION LINEAR POSITION SENSOR FOR USE IN HIGH TEMPERATURE, HIGH PRESSURE ENVIRONMENT.

BACKGROUND OF THE INVENTION

1. Technical Field

The invention relates to the determination of the physical linear position of an object that in itself is located in a harsh environment, and more particularly, includes systems required in the field of nuclear power generators.

2. Background Art

There are many position sensors and range detectors that are commercially available. Some of these are known to use the measuring technique of linear resistive sensing. However, these known measuring schemes and devices cannot operate in the harsh environments, such as high temperature, high pressure, or various fluid environments, which this invention can. Moreover, no such position sensors are known to operate continuously within the core of a nuclear reactor.

The present invention is a high resolution, high reliability, magnetically coupled, linear position sensor that provides a means of determining the position of an object using a methodology that does not require a hard mechanical or physical connection between the sensor and the object whose position is to be determined. The present invention can operate in harsh environments such as those having high temperature (650° F., 343° C.), high pressure (2500 psia, 172 Bars, 17236893 Pa), or various fluid (air, water, oil, etc.) with exposure to moderate levels and types of radioactivity, including those characteristic of a nuclear power plant core having neutron flux, gamma ray, heat, and other radiations. The sensor utilizes dual rod elements with a magnetically coupled bridging contact "slider" supported by a ceramic guide all of which are contained within a non magnetic pressure housing. The topology of the sensor supports at least two types of measurement techniques, Time Domain Reflectometry (TDR) as well as linear resistive to determine target position.

Although the nature of each component of the sensor is simple as considered individually, the collective application of the rod elements, spherical shaped slider, and the ceramic guide are a novel approach to provide a high resolution, high reliability sensor. Moreover, all of the materials used to fabricate the components as described herein are selected to satisfy the temperature operating range, which may be a nontrivial determination.

The inserted position of a control rod assembly used in a nuclear reactor core must be determined with high accuracy. Additionally, incremental linear motions of the control rod assembly must be determined so that the need for a measuring sensor with high resolution is necessary. This capability allows the most efficient management of nuclear control rod consumption promoting a high efficiency. It is also a redundant means of verifying a SCRAM function. All existing reactor plant control rod sensors are strictly used outside of the reactor core through extensions of the control rod into an integrated standpipe within the reactor head. To minimize complexity, this sensor will operate within the reactor core, utilizing only a small penetration for wiring.

The result of this or similar applications is that the position sensor will see a very harsh environment. It can be immersed in water (the reactor coolant media). The pressures can be as high as 2500 psig (17236893 Pa, 172 Bars). The temperature will range from −32° F. (−36° C.) to a maximum of 650° F. (343° C.), additionally the sensor will be exposed to radiation.

The linear position sensor of the present invention solves all of these problems and is adaptable to the other applications mentioned herein.

While the above references introduce and disclose a number of noteworthy advances and technological improvements within the art, none completely fulfills the specific objectives achieved by this invention.

DISCLOSURE OF INVENTION

The linear position sensor of the present invention is a high resolution, high reliability, magnetically coupled, linear position sensor that can operate in environments that may include high temperature (650° F., 343° C.), high pressure (2500 psia, 172 bars), or with various fluid (air, water, oil, etc.) and may include exposure to moderate levels of radioactivity. The sensor utilizes dual rod elements with a bridging contact "slider" supported by a ceramic guide all of which are contained within a non magnetic pressure housing. The topology of the sensor supports at least two types of measurement techniques, Time Domain Reflectometry (TDR) as well as linear resistive to determine target position.

The sensor of the present invention in essence provides a means of determining the linear position of a selected object. The linear range is unlimited. Either sensing methodology (such as TDR or linear resistive) provides high accuracy and resolution of position. The mechanical configuration allows for an implementation that does not require a hard mechanical or physical connection between the position sensor and the object whose position is being measured. The packaging concept, or design, and selection of materials allows this sensor to be used in a harsh environment, i.e., one exhibiting high pressure, a potentially contaminating fluid environment, a high ambient operating temperature and a varying ambient temperature environment and an ambient temperature environment that can exhibit a temperature gradient. As the sensor only has a single moving part (sphere within cylindrical shaped guide) it will provide a high degree of reliability. The cylindrical geometry also facilitates a small footprint while maintaining a significant pressure boundary.

While the present invention has application to nuclear reactors, the present invention can be applied to any application where the design requirements mandate the measurement of linear position with high accuracy and resolution in a harsh environment. Since the present invention has no limitation on measurement length, the linear resistive rod sensor of the invention can be used in a variety of military, commercial and industrial applications where the features, characteristics and capabilities of this sensor will prove beneficial. As such, the present invention can be applied to any system or application to include, but not limited to:

Commercial nuclear power plants
Military nuclear power plants
Material processing systems and plants
Chemical processing systems and plants
Undersea well exploration & drilling
Geothermal well systems
Industrial ovens/furnaces Additionally, while the implementation of this invention as described has, as its intended initial application, the measurement of the linear position of an object, it can be configured to measure the rotary (angular) position of an object.

In accordance with the present invention, a high resolution, high reliability, magnetically coupled, linear position sensor that provides a means of determining the position of an object using a methodology that does not require a hard mechanical or physical connection between the sensor and the object whose position is to be determined.

Embodiments of the present invention provide a system and method for a robust linear position measurement sensor that can operate in harsh environments that may include characteristics such a high temperature (650° F., 343° C.), high pressure (2500 psia, 172 bars), or with various fluid (air, water, oil, etc.) environments and may also include exposure to moderate levels of radioactivity. The sensor utilizes dual rod elements with a magnetically coupled bridging contact "slider" supported by a ceramic guide all of which are contained within a non-magnetic pressure housing. The topology of the sensor supports at least two types of measurement techniques, Time Domain Reflectometry (TDR) as well as linear resistive to determine target position.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

Figure 1:
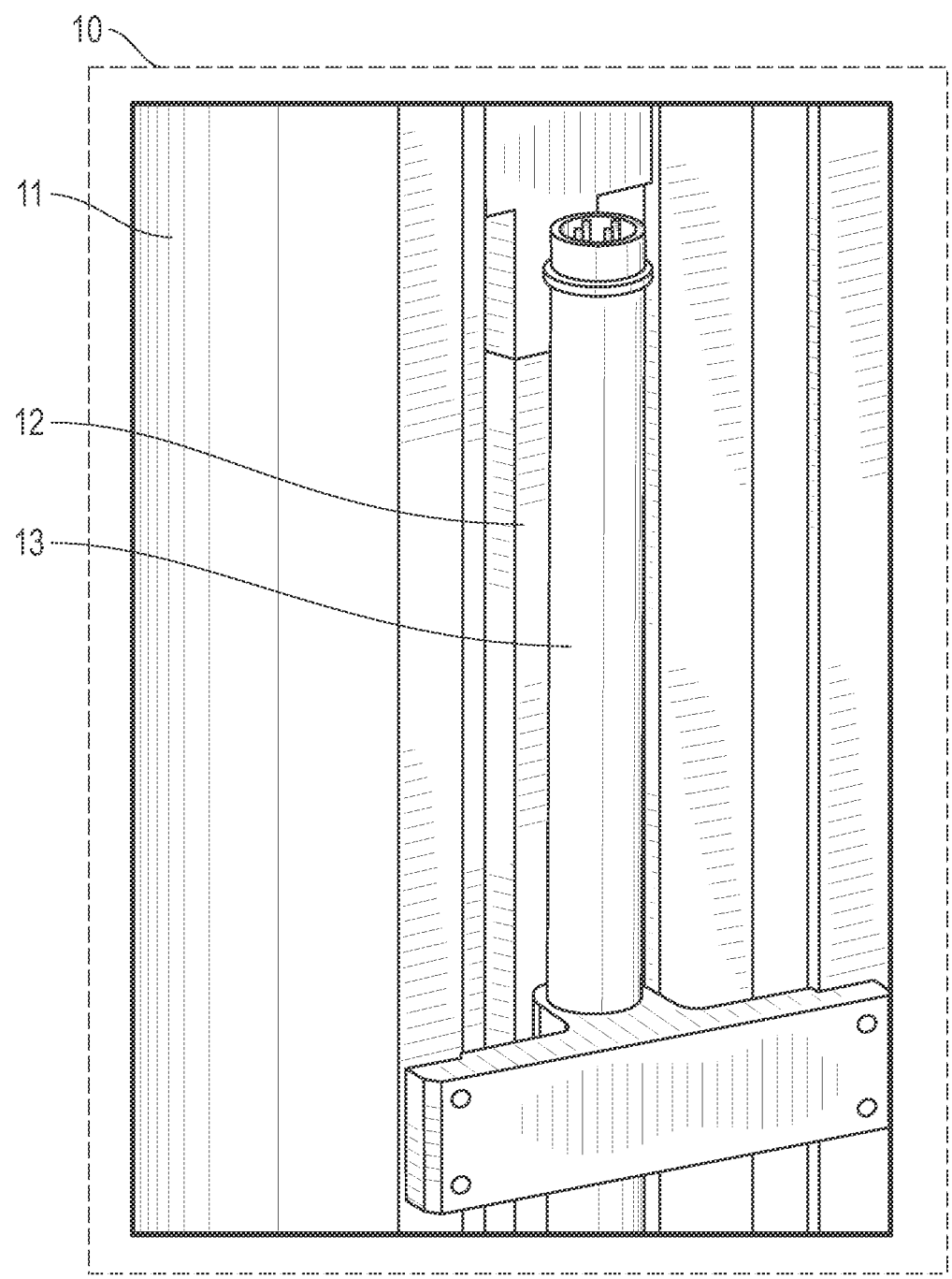
FIG. 1 illustrates a frontal isometric view of the housing of the linear position rod sensor of one embodiment of the present invention mounted within a control rod drive mechanism (CDRM) of a typical reactor vessel of a nuclear power generator.
Figure 2:
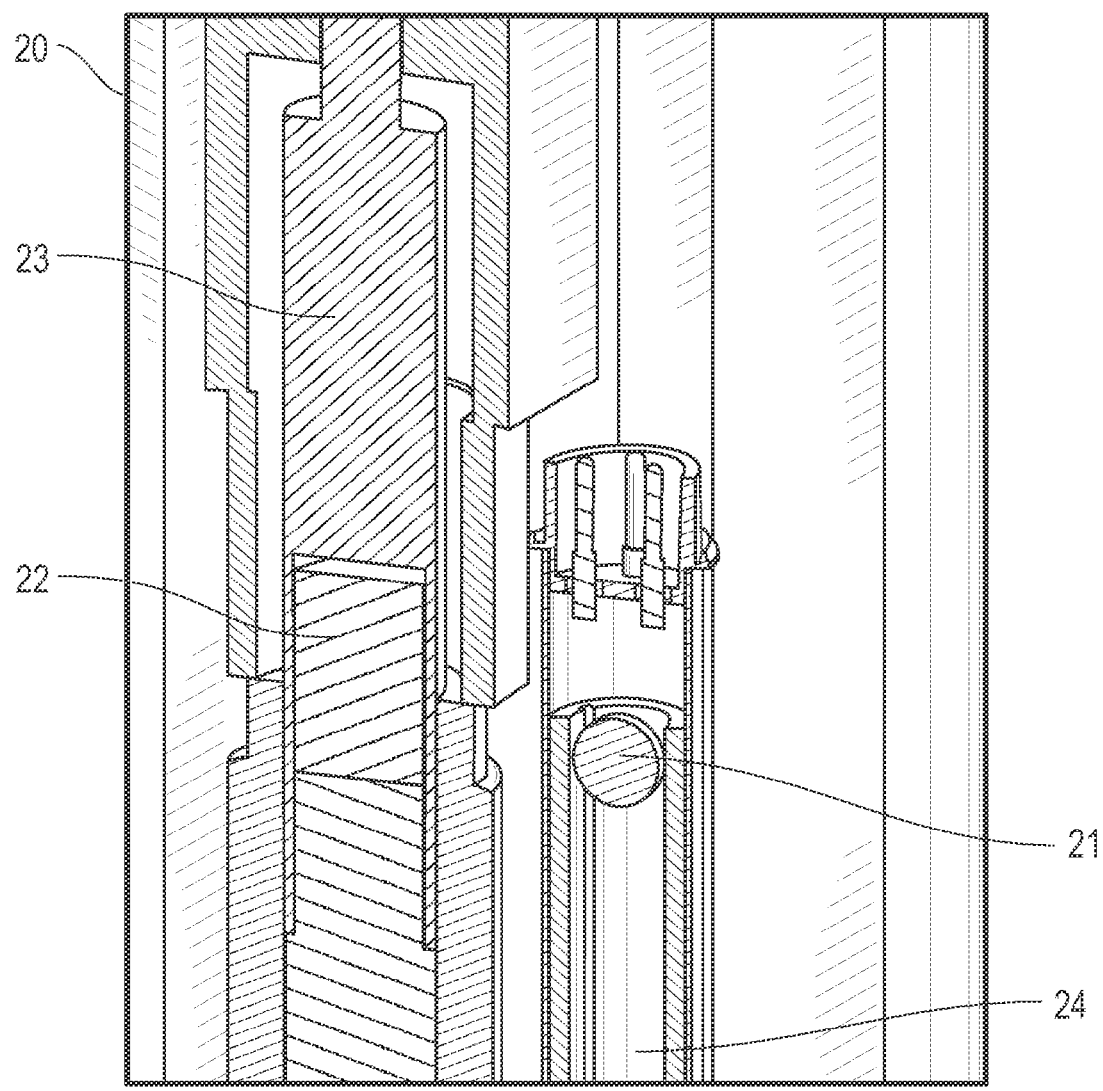
FIG. 2 illustrates one embodiment of a cross sectional view of the linear position rod sensor and CDRM of FIG. 1.

Referring to FIGS. 1 and 2, a preferred embodiment of the present invention of a high resolution, high repeatability linear position sensor applicable to harsh environments, and more particularly, includes systems required in the field of nuclear power generators. FIG. 1 illustrates a frontal isometric view of a housing of a linear resistive rod sensor (Sensor) 13 of one embodiment of the present invention mounted within a control rod drive mechanism (CDRM) 10 of a reactor vessel of a nuclear power generator. FIG. 2 illustrates a cross sectional view of the Sensor and CDRM of FIG. 1.

The initial application for a Sensor 13 is to measure the position of a control rod which moderates the rate of fission within a nuclear reactor. The Sensor 13 is mounted within the CRDM housing 11 in close proximity to the center axis; however it does not make physical contact with the actual control rod. Inside the Sensor 13 is an electrically conductive, magnetically permeable or permanent magnet, spherically shaped sliding element (Slider) 21, which is magnetically coupled by the radial pull of the embedded magnet 22 within the control rod drive 12. During movement of the control rod, the Slider 21, internal to the Sensor 13, will move in a synchronous fashion relative to the position of the embedded magnet 22 of the control rod drive 12. The function of the Slider 21 is to physically and electrically connect the different linear resistive rod elements 24 (also, FIG. 3, 32) at a point corresponding to said Slider 21 which is correlated to the position of the control rod. This completed circuit 61 across the linear resistive elements 32 within the Sensor 13, creates a path for an electrical signal 60, completing the electrical circuit unique to each possible position of said Slider 21, to measure the location of said Slider 21 as well as the embedded magnet 22 and therefore the control rod.

Figure 3:
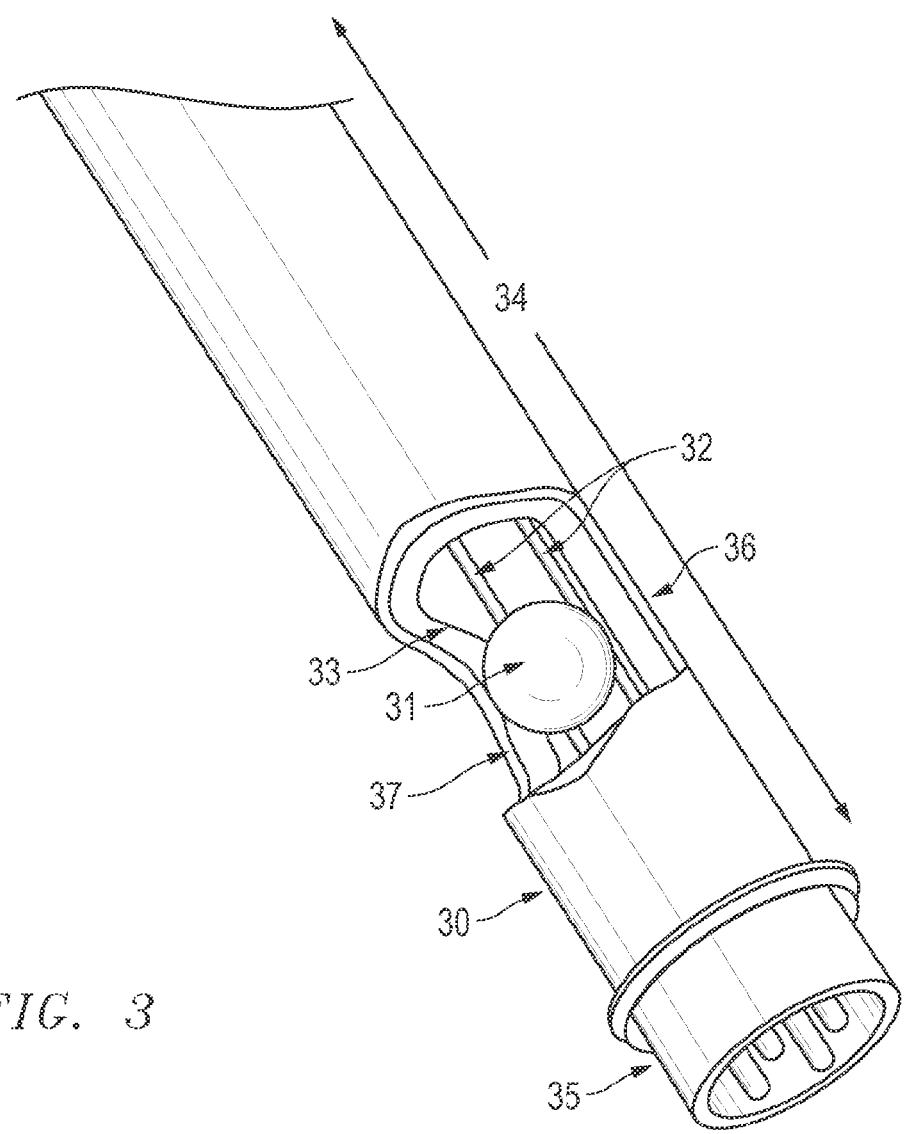
FIG. 3 illustrates one embodiment of an isometric view of the present linear position rod sensor with a portion of the housing cut-away to expose the interior.
Figure 4:
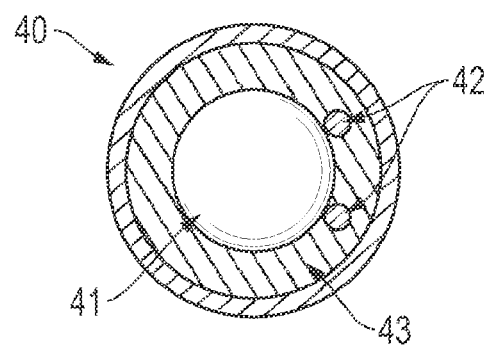
FIG. 4 illustrates one embodiment of a cross sectional view of the linear position rod sensor of the present invention taken in front of the contact slider of FIG. 3; and, FIG. 5 illustrates a schematic view of one embodiment of the present invention of a sensor in a three wire type system.

Referring to FIGS. 3 and 4, a referred embodiment of the present invention of a high resolution, high repeatability linear position sensor applicable to harsh environments, and more particularly, includes systems required in the field of nuclear power generators. FIG. 3 illustrates one embodiment of an isometric view of the present linear resistive rod sensor (Sensor) 30 with a portion of the housing cut-away to expose the interior 36. FIG. 4 illustrates a cross sectional view of the Sensor 30 of the present invention taken in front of the contact slider (Slider) 31, of FIG. 3.

The linear position Sensor 30 utilizes a magnetically coupled, conductive, spherically shaped contact slider (Slider) 31, 41 and two rod shaped linear resistive elements 32, 42 supported by a ceramic insulator 33, 43 all of which are contained within a sealed non-magnetic tube or sensor housing 37, 40 that may be composed of a suitable non-magnetic material that may be anon-magnetic metal, stainless steel, or other suitable material. A key novelty of the sensor is the geometry. As mentioned, all of the components of the sensor as considered individually are well known in material and principle, albeit some are state of the art. It is the assemblage of the components in geometric form, as embodied in the present invention that make the sensor possible. First and foremost the cylindrical outer tube is the optimal structural shape for the pressure boundary, it also makes it possible to position the sensor as close as possible to the target. The tube or sensor housing 37, 40 serves as the primary structural component and is the pressure barrier of the Sensor 30; the cylindrical shape is optimal for this function. Additionally the cylindrical shape permits a close tangential positioning of the sensor to the target control rod, thereby maximizing the magnetic interaction between the two. The interior of the sensor can be pressurized with an inert gas or maintained at a partial vacuum. Inside the metallic tube is a ceramic lining 33, 43 in the shape of the tube with an inner diameter slightly larger than the spherically shaped Slider 31, 41 permitting the said Slider a free running fit. The concentric ceramic lining also serves as a secondary structural component, reinforcing the outer metallic tube. There are two relatively small diameter cylindrical shaped grooves approximately 45° apart cut into the inner diameter of the ceramic lining that extend the full length of the Sensor 34. Solid metallic or semi-metallic linear resistive element rods (Resistive Rods) 32, 42 inserted into each groove protrude slightly past the inner diameter of the ceramic lining. The resistive rods preferably are continuous in length over the full range (length) of the sensor.

The ceramic lining material is a dielectric thereby electrically isolating the Resistive Rods 32, 42 from one another and serves as a guide for the Slider 31, 41. As there is only the single moving part, that is the Slider 31, 41, given the cylindrical geometry of the ceramic and spherical shaped slider, it is impossible to jam and thereby provides a high degree of reliability. When installed on the CRDM housing (FIG. 2, 20), the Sensor 30 is oriented with its main axis in the vertical direction and with Resistive Rods 32, 42 positioned as close as possible (equally) to the center line of the control rod, such that the radial pull of the magnet draws the Slider 31, 41 against the Resistive Rods 32, 42. As the control rod moves, the Slider 31, 41 traverses up or down the Resistive Rods 32, 42 in a synchronous fashion relative to the position of the embedded magnet (FIG. 2, element 22).

Figure 5:
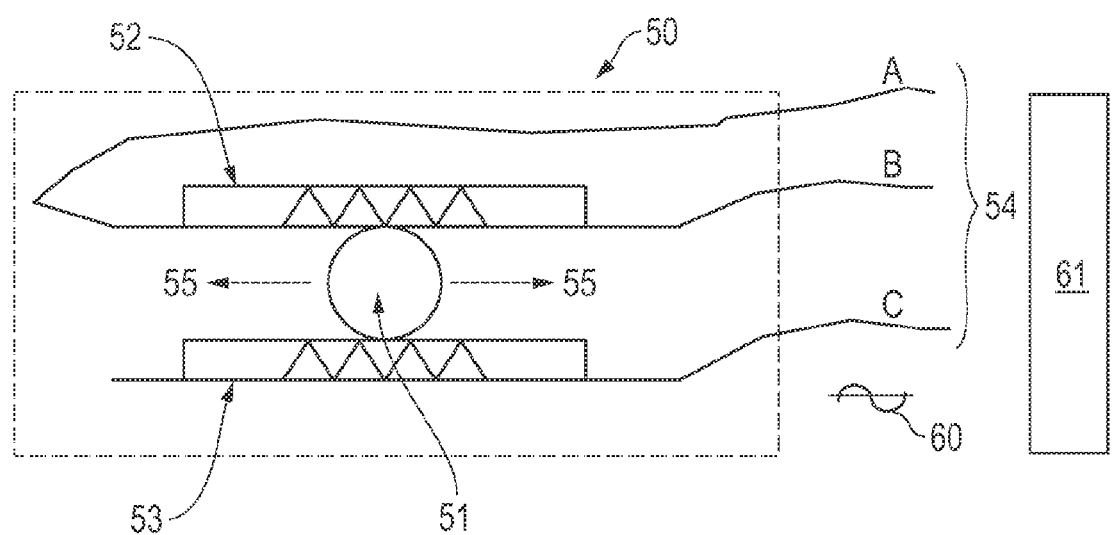

Referring to FIG. 5, a preferred embodiment of the present invention of a high resolution, high repeatability linear position sensor applicable to harsh environments, and more particularly, includes systems required in the field of nuclear power generators. FIG. 5 illustrates a schematic view of one embodiment of the present invention of a sensor in a three wire type system.

An application of the linear resistive rod sensor (Sensor) 50 may be to use a linear resistive measurement to determine the position of a control rod within a nuclear power generator. A set of linear resistive elements are contacted by a magnetically coupled, conductive, spherically shaped contact slider (Slider) 51 that is restricted to move 55 in contact along said linear resistive elements and performs a shorting function electrically connecting the two or more linear resistive rod elements at the point of the Slider 51. Within the described embodiment of the invention and in accordance with the aforementioned descriptions of FIGS. 1 through 4, one of the two linear resistive elements 52, 53 is a low electrical impedance (conductive) material 53 and the other is a substantially higher impedance (resistive) material 52. The high impedance linear resistive element 52 provides an easily identifiable change in resistance for a small step in rod position.

The low impedance element should be used to connect the Slider 51 back to an electrical measuring device and is insignificant in the total overall resistance added to the measurement, but can possibly be high enough to affect the ratio of the two connected linear resistive elements 52, 53. The ratio of these resistances corresponds directly to the position of the Slider 51, as a percent of full scale and therefore correlates directly to the position of the control rod as a percent of the total travel. The linear resistive elements 52, 53 and the Slider 51 form a three wire 54 ratiometric type measurement system that uses the ratio of the full scale resistance, indicated by the electrical resistance from point A to B, to the fractional resistance corresponding to the location of the slider within the element, indicated by the electrical resistance from point A to point C.

The spherical type Slider 51 gives the unit a precise line of contact across the two linear resistive elements 52, 53, thereby providing high resolution which is only limited by the precision of the meter connected to the sensor output. As such, resolutions of a fraction of an inch can be achieved. Position accuracy is determined by the line of contact of the sliding element, rod element properties and the ratiometric measuring scheme which provides built in temperature compensation. Unlike other position sensors used in applications where the ambient temperature varies, correction of the output signal to compensate for ambient temperature change is unnecessary. Temperature compensation is built into the topology of the sensor in that a ratiometric measurement is employed in which the full scale or total travel measurement is known and the partial scale measurement coinciding with a targeted position is then divided by the full-scale measurement. The resulting fraction is the exact percent of full scale displacement, and as such position accuracies of approximately 0.1% of full scale can be achieved.

With further reference to FIG. 5, within the described embodiment of the invention and in accordance with the aforementioned descriptions of FIGS. 1 through 4, a second means of measurement, Time Domain Reflectometry (TDR), can be directly adapted to the afore specified three wire 54 measurement system where the Slider 51 performs a shorting function electrically connecting the two linear resistive elements 52, 53. In using TDR as the measurement technique, the linear resistive elements 52, 53 are conductors both having low impedance. With reference to the illustrated three wire 54 measurement system, applying a measurement using TDR is performed in the following manner:

[1] a pulse is first generated at point A with point B left unconnected, and,

[2] point C is attached to ground,

[3] resulting in a reflection of the original pulse at the Slider 51 location due to the change in impedance,

[4] where the reflection measured back at point A is used to determine distance from point A to the Slider 51 location;

[5] analogously, a second pulse is then generated at point B with point A floating and again with point C attached to ground, resulting in a reflection at the location of the Slider 51 due to the change in impedance,

[6] where the reflection measured back at point B is used to determine the distance from point B to the Slider 51.

A ratiometric calculation of the distance from A to the slider divided by the sum of the distances from A and B to the slider gives the actual distance as a percent of full scale and thereby it is automatically temperature compensated.

The Sensor 51 preferably is constructed from materials selected by the user that are suitable to withstand operating within the specific desired or chosen environment for the present invention as embodied here the notional material choices are stainless steel for the outer tube, steatite or alumina for the ceramic lining, copper alloy with an appropriate plating for corrosion resistance for the low impedance linear resistive element, a semimetal or ceramic rod with plating for the high impedance element, and high magnetically permeable nickel-iron alloy with overplating for corrosion resistance for the slider.

The foregoing disclosure and description of the invention are illustrative and explanatory thereof, and various changes in the size, shape and materials, as well as in the details of the illustrated construction may be made without departing from the spirit of the invention.

What is claimed is:

1. A system for implementing a high resolution, high reliability, magnetically coupled, linear position sensor system, the system comprising:

a sensor that utilizes a ratiometric measuring scheme for providing built-in temperature compensation;

the sensor having a sensor topology that supports measurement techniques including time domain reflectometry and linear resistive measurements;

the sensor including a sensor architecture for enabling the sensor system to use more than one type of input and response to measure position;

the sensor formed having a sensor geometry including a plurality of conductive rod shaped resistive elements with at least two rod shaped resistive elements arranged essentially parallel to one another supported by a ceramic guide within a structural housing; one of the two rod shaved resistive elements is formed from a low electrical impedance (conductive) material and a second of the two rod shaped resistive elements is formed from a substantially higher impedance (resistive) material;

a slider element forming a bridging contact mechanism of the sensor having at least one moving part having high reliability to easily operate within a harsh environment using selected materials appropriate for a desired operating environment to construct the electro-mechanical elements of the sensor; said at least one moving part of the sensor is spherical shaped and provides a precise line of contact across two rod shaped resistive elements; and, the sliding element being magnetically coupled to an object being tracked;

whereby the sensor provides a non-contact sensing ability for determining position of the object being tracked.

2. The invention of claim 1 wherein said sensor has a single moving part.

3. The invention of claim 1 wherein the housing, and said sensor being adapted for a high temperature and high pressure environment.

4. A method of using the sensor according to claim 1 for defining and implementing a high resolution, high reliability, magnetically coupled, linear position sensor system, comprising the steps of:

receiving a magnetic field in a conductive and magnetically susceptible spherically shaped contact slider where said magnetic field is emanating from an embedded magnet on a target control rod;

synchronizing the movements of the control rod with the spherically shaped contact slider via said magnetic field to produce a sensor where the position of said spherically shaped contact slider is reproducibly and consistently coupled to positions of said target control rod;

maintaining constant relative position between the target control rod and the spherically shaped contact slider without direct mechanical connection between the spherically shaped contact slider and target control rod;

moving the spherically shaped contact slider by means of magnetic coupling to the target control rod in such a way as to maintain positional synchronization between said target control rod and said spherically shaped contact slider;

completing a circuit between a set of at least two parallel arranged resistive rod shaped elements with the spherically shaped contact slider where said spherically shaped contact slider makes a physical and electrical connection with said set of resistive rod shaped elements thereby creating a path, or set of paths, resulting in at least one unique electrical signal to be measured corresponding to possible positions of the spherically shaped contact slider; one of two rod shaped resistive elements is formed from a low electrical impedance (conductive) material and a second of the two rod shaped resistive elements is formed from a substantially higher impedance (resistive) material;

measuring unique electrical signal(s) as derived from the resulting resistance, or combination of resistances of a set of resistive rod shaped elements, of the completed circuit involving the spherically shaped contact slider and the set of resistive rod shaped elements.

5. The method of claim 4 further including the step of maintaining said positional synchronization of the control rod and the spherically shaped contact slider in a manner that is indifferent to all environmental extremes.

6. The method of claim 4 further including the step of restricting the spherically shaved contact slider to move in constant contact on a set of fixed resistive rod shaped elements, each possessing a distinct linear electrical resistivity.

7. The method of claim 4 further including the step of utilizing a ratiometric measurement technique for sensing position of the target control rod utilizing an exact position of the spherically shaped contact slider and thereby the target control rod as a percent of full traversing range is obtained.

8. The method of claim 4 further including the step of measuring a unique electrical signal as derived from the resulting time domain reflectometry of the completed circuit involving the spherically shaped contact slider and the set of resistive rod shaped elements.

* * * * *